(12) United States Patent
Akhavain et al.

(10) Patent No.: US 6,913,343 B2
(45) Date of Patent: Jul. 5, 2005

(54) METHODS FOR FORMING AND PROTECTING ELECTRICAL INTERCONNECTS AND RESULTANT ASSEMBLIES

(75) Inventors: Mohammad Akhavain, Escondido, CA (US); Joseph E. Scheffelin, Poway, CA (US); Noah Lassar, San Diego, CA (US); Conrad Lepe, Escondido, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 97 days.

(21) Appl. No.: 10/426,584

(22) Filed: Apr. 30, 2003

(65) Prior Publication Data

US 2004/0218009 A1 Nov. 4, 2004

(51) Int. Cl.[7] .................. B41J 2/14; B41J 2/16
(52) U.S. Cl. ........................ 347/50; 347/58
(58) Field of Search ................ 347/50, 58, 86; 438/108, 613

(56) References Cited

U.S. PATENT DOCUMENTS

| | | | |
|---|---|---|---|
| 5,147,084 A | | 9/1992 | Behaun et al. |
| 5,258,781 A | | 11/1993 | John |
| 5,450,101 A | | 9/1995 | Ishida et al. |
| 5,681,757 A | | 10/1997 | Hayes |
| 6,071,427 A | | 6/2000 | Raulinaitis |
| 6,105,852 A | * | 8/2000 | Cordes et al. ............. 228/254 |
| 6,133,072 A | | 10/2000 | Fjelstad |
| 6,142,609 A | | 11/2000 | Aoki |
| 6,188,414 B1 | | 2/2001 | Wong et al. |
| 6,206,507 B1 | | 3/2001 | Hino |
| 6,241,340 B1 | | 6/2001 | Watanabe et al. |
| 6,283,359 B1 | | 9/2001 | Brofman et al. |
| 6,328,427 B1 | | 12/2001 | Watanabe et al. |
| 6,329,609 B1 | | 12/2001 | Kaja et al. |
| 6,357,864 B1 | | 3/2002 | Sullivan et al. |
| 6,364,475 B2 | | 4/2002 | Feinn et al. |
| 6,378,984 B1 | | 4/2002 | Steinfield et al. |
| 6,402,299 B1 | | 6/2002 | DeMeerleer et al. |
| 6,425,655 B1 | | 7/2002 | Patil |
| 6,426,241 B1 | * | 7/2002 | Cordes et al. ............. 438/108 |
| 6,659,591 B2 | * | 12/2003 | Sato et al. .................. 347/50 |
| 2001/0013423 A1 | | 8/2001 | Dalal et al. |
| 2002/0003556 A1 | | 1/2002 | Mori |
| 2002/6433419 | | 1/2002 | Mori |
| 2002/0093550 A1 | | 7/2002 | Watanabe |
| 2002/0113324 A1 | | 8/2002 | Cordes et al. |
| 2002/0117330 A1 | | 8/2002 | Eldridge et al. |

* cited by examiner

*Primary Examiner*—Thinh Nguyen

(57) ABSTRACT

The described embodiments relate to methods and systems for forming and protecting electrical interconnect assemblies. In one embodiment, an electrical interconnect assembly forming method forms an electrical interconnect between one or more conductors of a first support structure and one or more conductors of a second support structure. The method also distributes a generally flowable material over the electrical interconnect and exposes the generally flowable material to conditions sufficient to render the generally flowable material into a generally non-flowable state that provides fluid protection to the electrical interconnect and supports the electrical interconnect to reduce stress concentration at the electrical interconnect.

18 Claims, 7 Drawing Sheets

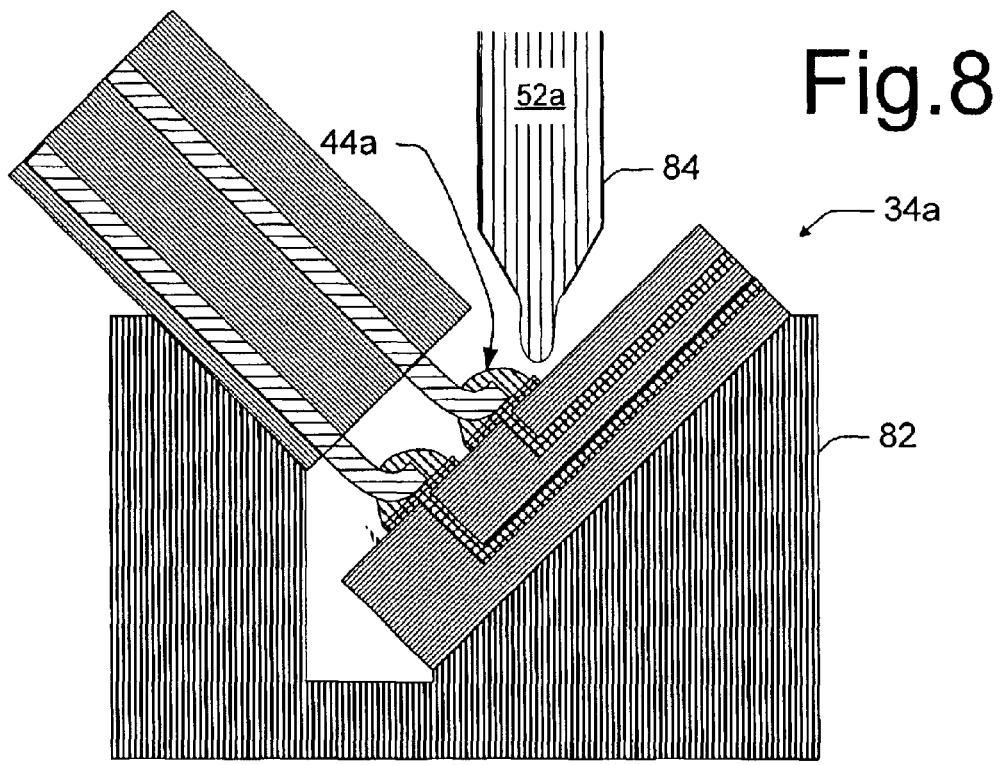
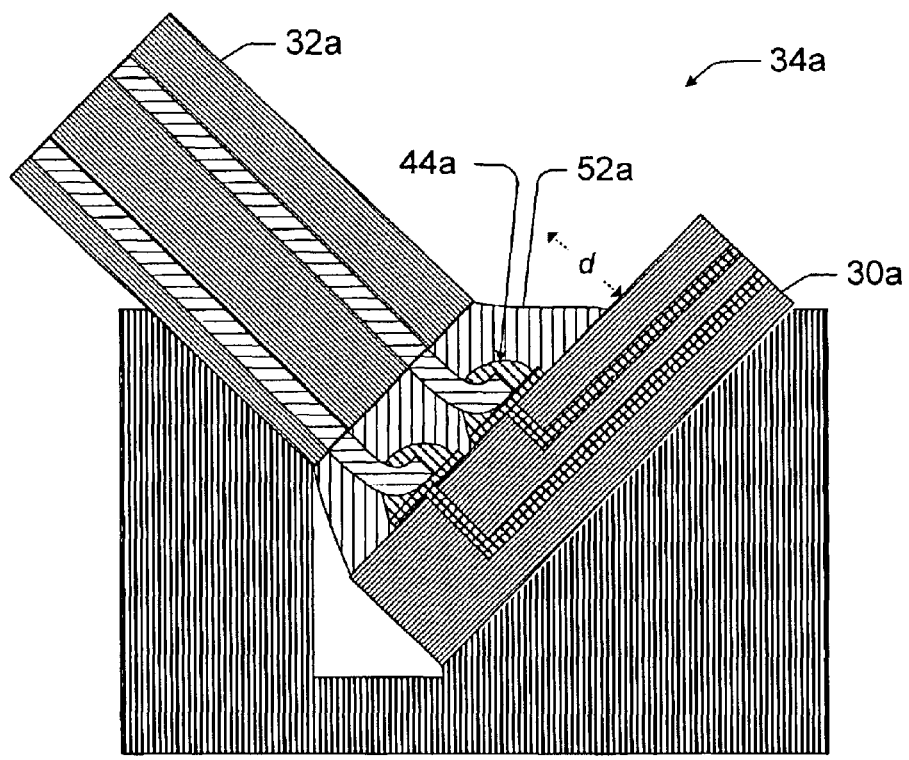

METHODS FOR FORMING AND PROTECTING ELECTRICAL INTERCONNECTS AND RESULTANT ASSEMBLIES

BACKGROUND

Electronic devices which operate in potentially deleterious environments pose challenging design problems. The environment may be due to external factors or to conditions caused by the electronic device itself. In one such example, ink jet printing devices eject fluidic ink from multiple nozzles arranged on one or more print cartridges onto a print media to form a desired image. During the ink ejection process, some of the ink that is ejected does not actually contribute to the desired image, but instead becomes what is generally referred to as "non-target ink".

This non-target ink can assume various forms. Generally, the non-target ink becomes an aerosol, a powder, or liquid colloid among others, and as such can drift and land on components of the printing device especially the print cartridge(s). The non-target ink can degrade certain components, most notably various electrical conductors that are commonly comprised of metal. The conductors can be especially difficult to protect from degradation where two or more conductors form a connection or "electrical interconnect".

For these and other reasons, there is a need for the present invention.

BRIEF DESCRIPTION OF THE DRAWINGS

The same components are used throughout the drawings to reference like features and components.

FIG. 8 shows another cross-sectional view of components that can be configured to form an exemplary electrical interconnect assembly in accordance with one implementation of one embodiment. In this representation, the components are positioned in a workstation FIG. 9 shows a cross-sectional view of an exemplary electrical interconnect assembly positioned in a workstation in accordance with one embodiment.

DETAILED DESCRIPTION OF THE PREFERRED EMBODIMENT

Overview

The embodiments described below pertain to methods for protecting electrical interconnects from degradation. An electrical interconnect comprises at least one conductor electrically coupled or interconnected to another conductor. One suitable electrical interconnect comprises a first conductor that is electrically coupled to a second conductor with solder or other material. The electrical interconnect has a protective material positioned over at least a portion thereof to protect the electrical interconnect from degradation. In some embodiments, the protective material is distributed in a generally flowable state around at least a portion of the electrical interconnect and/or proximate portions of the first and second conductors. The protective material can then be rendered into a generally non-flowable state that can provide fluid and/or ink protection to the electrical interconnect.

The electrical interconnects commonly occur as "electrical interconnect assemblies" where one or more conductors are supported by a first support structure and are electrically interconnected to one or more conductors supported by a second support structure. The electrical interconnect can be especially susceptible to degradation and can be protected by the protective material. In some embodiments, the protective material can also provide electrical insulation and/or mechanical stabilization to the electrical interconnect assembly.

The embodiments described herein are employed in the context of electrical interconnect assemblies that comprise a portion of an ink jet print cartridge. It is to be appreciated and understood that various embodiments are equally applicable in other non-ink jet contexts as well. For example, a coastal marine environment can expose electrical devices to moist, salt laden air which can promote degradation of the device. The described embodiments can be utilized to reduce such degradation.

Exemplary Printing Device

Figure 1:
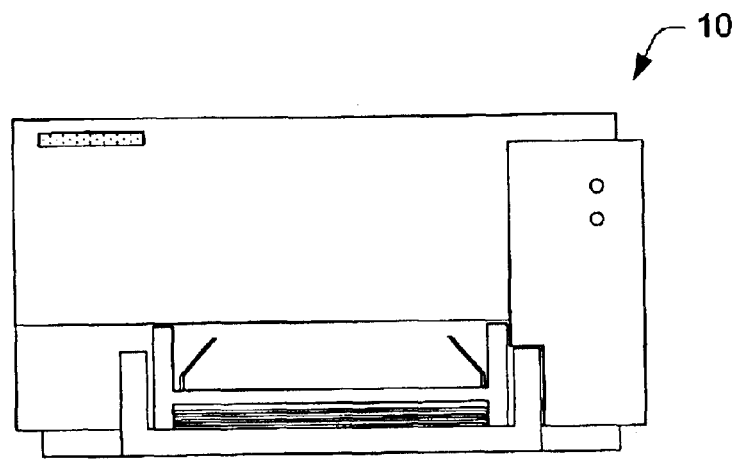
FIG. 1 shows a front elevational view of an exemplary printing device.

FIG. 1 shows a printing device, embodied in the form of an ink jet printer 10. The printer 10 may be capable of printing in black-and-white and/or in color. The term "printing device" refers to any type of device which ejects fluids, such as dye or pigment based inks, or other suitable materials onto a print media to form a desired image. Though an inkjet printer is shown for exemplary purposes, it is noted that aspects of the described embodiments can be implemented in other forms of printing devices that employ inkjet printing elements or other fluid ejecting devices, such as facsimile machines, photocopiers, and the like.

Figure 2:
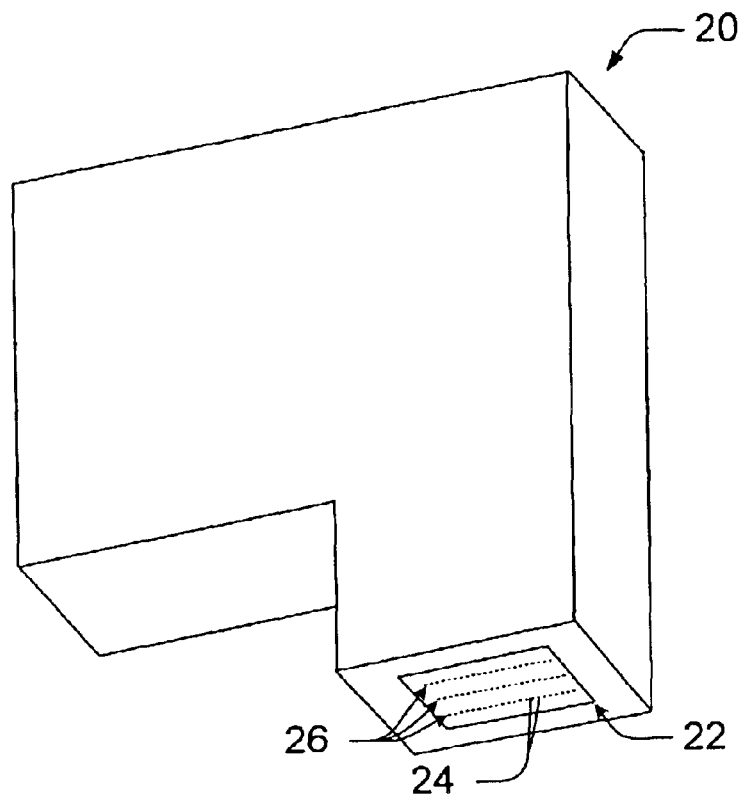
FIG. 2 shows a perspective view of an exemplary print cartridge according to an embodiment of the present invention suitable for use in some exemplary printing devices.

FIG. 2 shows a print cartridge 20 that can be installed in the ink jet printer 10. The print cartridge can be electrically coupled with and controlled by a controller, such as a processor, to selectively eject ink to form a desired image.

The print cartridge 20 has one or more print head(s) 22 each of which includes one or more nozzle(s) 24 arranged in one or more generally linear nozzle array(s) 26. A fluid, such as ink, can be selectively ejected from individual nozzles 22 to create a desired image on a print media such as paper, transparencies, etc. In various embodiments, the print cartridge 20 and/or the print media can be moved relative to one another to form portions of the desired image. The print cartridge 20 can contain an internal ink source and/or be connected to an external ink source for supplying ink to the various nozzles 24.

FIG. 2 shows a print cartridge 20 that can be installed in printing devices, such as ink jet printer 10. The print cartridge can be electrically coupled with and controlled by a controller, such as a processor, to selectively eject ink to form a desired image on a print media. A print cartridge may be designed to be replaceable during the life of the printing device or may be designed to have a functional lifespan equal to or greater than the printing device.

Figure 3:
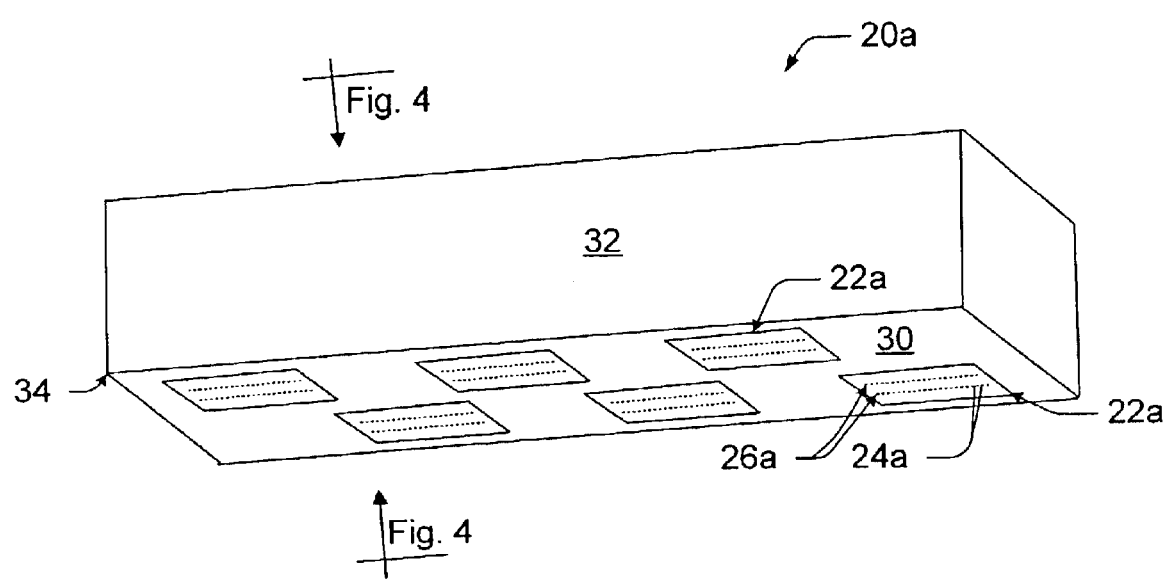
FIG. 3 shows a perspective view of another exemplary print cartridge according to an embodiment of the present invention suitable for use in some exemplary printing devices.

FIG. 3 shows a print cartridge 20a that has multiple print heads 22a, individual ones of which comprise two generally linear nozzle arrays 26a. Each array has multiple nozzles 24a. The print heads 22a are positioned on a first support structure 30 of the print cartridge 20a. In this example, the first support structure 30 is oriented generally orthogonally to a second support structure 32. Collectively, first and second support structures provide an electrical interconnect assembly 34 which will be described in more detail below.

Exemplary Embodiments and Methods

Figure 4:
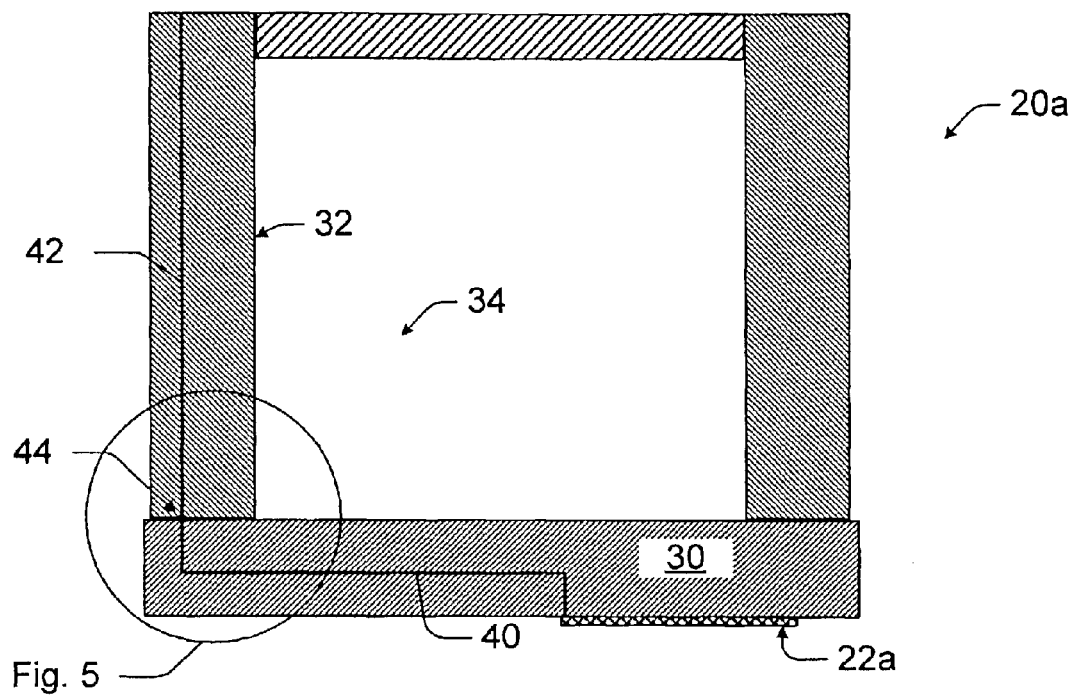
FIG. 4 shows a cross-sectional view of the exemplary print cartridge as shown and indicated in FIG. 3.

FIG. 4 shows a cross-sectional view taken transverse a long axis of print cartridge 20a as indicated in FIG. 3. As shown in FIG. 4, first support structure 30 supports print heads 22a and a first conductor 40. Second support structure 32 supports a second conductor 42. Support structures 30, 32 can support one or more conductors in various configurations including, but not limited to, portions and/or an entirety of the conductor being positioned on or within the support structure among others.

In this embodiment, the first conductor 40 is electrically coupled to print head 22a. The first conductor is also electrically coupled to the second conductor 42 at electrical interconnect 44 which is described in more detail below.

The first and second support structures 30, 32 can be comprised of any suitable material or materials. Additionally, the first support structure 30 can comprise the same materials as the second support structure or the support structures can comprise different materials. For example, in one embodiment, the first support structure is comprised of ceramic, such as a multilayer ceramic, while the second support structure comprises a polymer. Suitable support structures can be formed from a single material, or from multiple materials. Such support structures can be formed in any suitable way, such as injection molding, or formation of a composite material.

Figure 5:
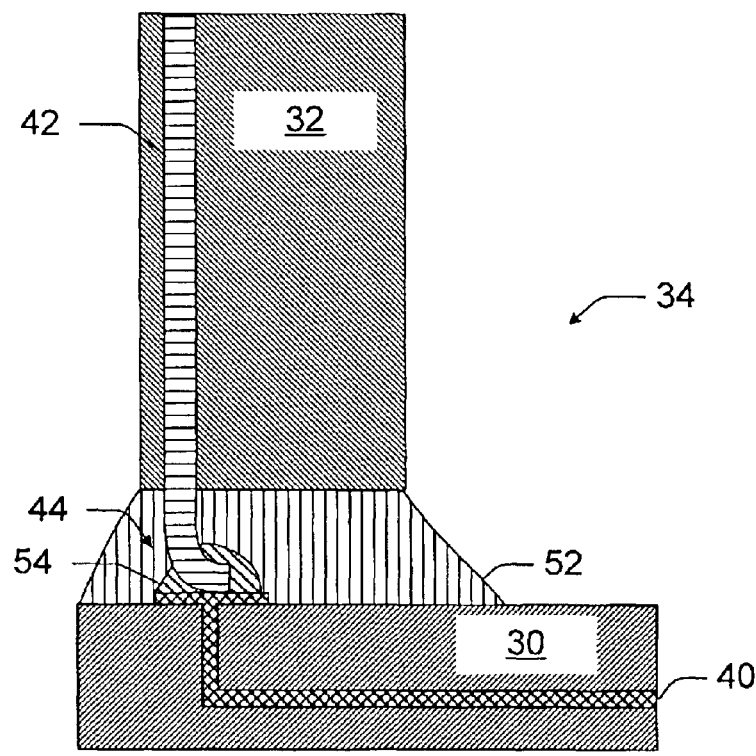
FIG. 5 shows a cross-sectional view of an enlarged portion of the cross-section shown in FIG. 4.

FIG. 5 shows an enlarged portion of print cartridge 20a shown in FIG. 4. FIG. 5 shows electrical interconnect assembly 34 comprising first support structure 30 and associated first conductor 40 along with second support structure 32 and associated second conductor 42. Electrical interconnect 34 also includes electrical interconnect 44, and a protective material 52 positioned over the electrical interconnect 44.

Electrical interconnect 44 electrically couples the first conductor 40 and the second conductor 42. Protective material 52 essentially surrounds the electrical interconnect 44 sufficiently to provide ink protection for the electrical interconnect. The protective material 52 can comprise any suitable material. One type of protective material comprises epoxy. The skilled artisan will recognize other suitable protective materials.

In some embodiments, an electrically conductive material, which in this embodiment comprises solder 54 electrically couples first and second conductors 40, 42 at electrical interconnect 44. As such, in this embodiment, electrical interconnect 44 comprises solder 54 and a portion of each of conductors 40, 42.

Alternatively or additionally to solder, other suitable electrically conductive materials can comprise, but are not limited to, conductive adhesives and braze materials. The discussion below refers to solder, but it is to be understood that other such electrically conductive materials can also be utilized.

In some embodiments, protective material 52 can also bond with, or otherwise adhere to, the first and/or second support structures 30, 32, and/or portions of the associated conductors at the electrical interconnects, to provide further ink protection. Further, in some of the embodiments other benefits associated with the protective material may also be realized.

For example, in some embodiments the protective material can provide increased mechanical strength between the first and second support structures. Alternatively or additionally, the protective material may also provide increased stabilization of the electrical interconnects. Some illustrative examples will be discussed in more detail below.

FIGS. 6–9 show a process for forming an electrical interconnect assembly.

Figure 6:
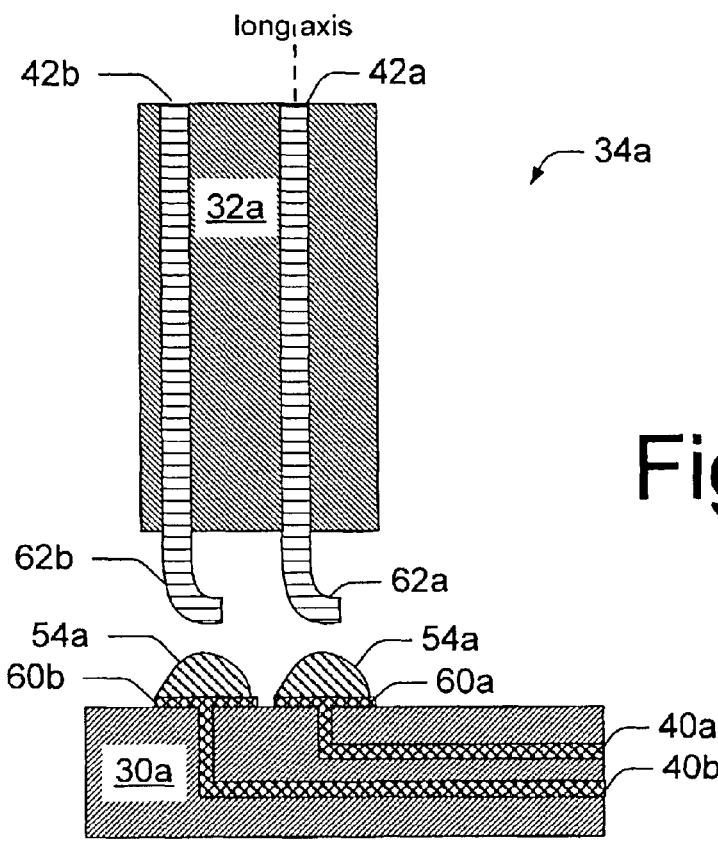
FIG. 6 shows a cross-sectional view of components that can be configured to form an exemplary electrical interconnect assembly in accordance with one embodiment.

Referring to FIG. 6, first support structure 30a supports a first set of conductors 40a, 40b. In this example, individual conductors 40a and 40b can have a terminal portion comprising terminal pads 60a and 60b respectively.

Conductors 40a, 40b can have solder 54a positioned thereon. In this embodiment, individual solder portions are positioned respectively on each of the individual terminal pads 60a, 60b. In some embodiments, the solder 54a comprises solder paste which can be silk-screened in a desired pattern to precisely position solder paste onto the individual conductors 40a, 40b and/or their respective terminal pads 60a, 60b as shown here. In some other embodiments, the solder paste can be stencil printed or hot-air leveled, among other methods of positioning. In some embodiments, solder 54a can have a cleaning component, such as a flux, to facilitate formation of an effective electrical interconnect as described in relation to FIG. 7.

FIG. 6 further shows a second support structure 32a supporting a second set of conductors comprising conductors 42a and 42b. Individual conductors 42a and 42b can have a terminal portion 62a and 62b respectively, that is oriented generally non-parallel to a majority of the associated conductor. In this embodiment, the terminal portions 62a and 62b comprise what is known as a "j-leg" configuration. The j-leg conductor configuration is characterized by an elongate, generally straight conductor portion that extends along a long axis toward a terminal portion that is not generally straight, but rather curved. The generally straight conductor portion constitutes a majority of the conductor, and the terminal portion extends generally away therefrom.

To achieve a desired electrical interconnect assembly, terminal portions of conductors supported by a given support structure may be arranged in various configurations. For example, the terminal portions may be arranged in linear or staggered configurations, among others.

Figure 7:
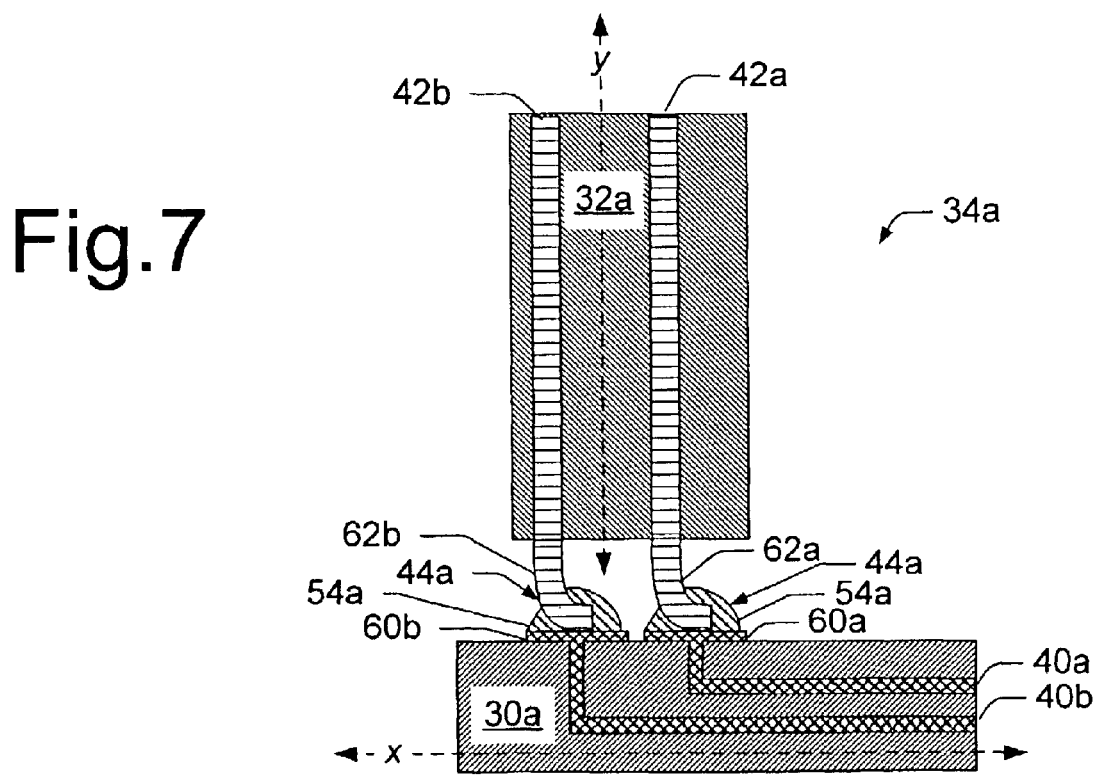
FIG. 7 shows a cross-sectional view of components that can be configured to form an exemplary electrical interconnect assembly in accordance with one implementation of one embodiment.

FIG. 7 shows the terminal portions 62a, 62b of conductors 42a, 42b positioned in electrical contact with the solder 54a and terminal pads 60a and 60b of the first support structure. The solder 54a can be melted and subsequently allowed to harden to form an effective electrical interconnect 44a.

In some embodiments, suitable solder can be chosen based on factors such as the melting temperature of the solder relative to a temperature at which damage may occur to the various components, such as first support structure 30a and second support structure 30b. Solder can be melted in any suitable way including, but not limited to, placing the components in a heated environment (oven) or positioning a thermal component in proximity to the solder to cause the solder to melt.

In this embodiment, the first and second support structures 30a, 32a are oriented generally perpendicular to one another. This can be seen by comparing the orientation of the first support structure's long axis designated x to the orientation of the second support structure's long axis designated y. Other embodiments can position the support structures generally parallel to one another or at other various angles relative to the two associated long axes. Several such examples are provided below in relation to FIGS. 10–12.

In some embodiments, a desired relative orientation of the first and second support structures can be achieved by holding the support structures at a desired angle while causing the protective material to become generally non-flowing. In some embodiments, the desired orientation can be different than the orientation during formation of the electrical interconnect.

In some embodiments, the electrical interconnect can also be annealed. Annealing can in some instances reduce stress in an electrical interconnect assembly. Annealing can occur at any suitable sequence in the formation of an electrical interconnect assembly. For example, some embodiments may be annealed after the formation of the electrical interconnect and before the protective material is applied. In some embodiments where heat is used to cure an epoxy protective material, annealing may result indirectly from the curing process. The skilled artisan will recognize other suitable embodiments.

FIGS. 8 and 9 illustrate one suitable implementation for distributing a generally flowable material over the electrical interconnect 44a. Here, the electrical interconnect assembly 34a is positioned in a work station 82 such as a jig. The work station 82 orients electrical interconnect assembly 34a to allow the protective material to be flowed over the electrical interconnect.

FIG. 8 shows the protective material 52a being distributed with a syringe 84 proximate electrical interconnect 44a. This is but one suitable distribution technique. Other suitable distribution techniques will be recognized by the skilled artisan.

In some embodiments, protective material 52a can be selected to have a sufficient viscosity to allow it to flow around the exposed conductors of the electrical interconnect 44a. In some of these embodiments, protective material 52a can move or flow, at least in part, due to capillary action. For example, in this embodiment, the distance d (shown FIG. 9) between the first support structure 30a and the second support structure 32a can be about 0.008 to 0.010 inches. At such a distance, the generally fluid protective material 52a can flow between the two support structures, at least in part, due to capillary action. This distance between the first and second support structures is but one exemplary distance where capillary action can contribute to movement of the generally flowable protective material. In some of these embodiments, such capillary action can aid in a more thorough distribution of the protective material 52a around the electrical interconnect 44a. In some embodiments, the temperature of the protective material and/or the temperature of the components can be controlled to favorably affect the flow characteristics of the protective material.

FIG. 9 shows the generally flowable protective material 52a distributed around electrical interconnect 44a to form a completed electrical interconnect assembly 34a. In this embodiment, protective material 52a also contacts first and second support structures 30a, 32a, though such need not be the case.

After protective material 52a is flowed over the interconnect, it can be exposed to conditions sufficient to render it into a generally non-flowable state that provides ink protection for the electrical interconnect. In embodiments, where the protective material 52a comprises epoxy, such a process can entail curing the protective material. Examples of conditions sufficient to facilitate the protective material becoming generally non-flowing can include heating the protective material, exposing it to UV light, and/or simply allowing it to sit undisturbed for a period of time.

If the material that was flowed over the interconnect is to be heated to harden it, then the appropriate choice for the flowable material is one that does not need to be heated above the melting temperature of the solder in order for it to be hardened. In one such example, a solder can be utilized having a melting temperature of about 200–230 degrees Celsius (C.). An epoxy type protective material can be selected which can be cured by heating it to approximately 120–150 degrees C. for a period of about 20 minutes to about 60 minutes. The skilled artisan will recognize other suitable combinations.

In some embodiments, heating the electrical interconnect assembly to cure the protective material can decrease the stress forces experienced by the various components of the electrical interconnect assembly. For example, where the electrical interconnect assembly is first heated to approximately 230 degrees C. to melt the solder the various components are subject to a large change in temperature upon returning to room temperature. When dissimilar materials are utilized in first and second support structures 30a, 32a the different materials may have different coefficients of thermal expansion and thus may be subjected to stress caused by the large change in temperature. Subsequently, if a protective material is applied and the electrical interconnect assembly is heated to a second lower temperature such as 130 degrees C. to cure the protective material, the change in temperature experienced by the electrical interconnect assembly is substantially lessened.

Further, in some embodiments, where the protective material bonds to the electrical interconnect and support structures, stress forces caused by the differing coefficients of thermal expansion may be spread out over a greater region of the electrical interconnect resulting in a lower failure rate of the electrical interconnect assemblies.

Figure 10:
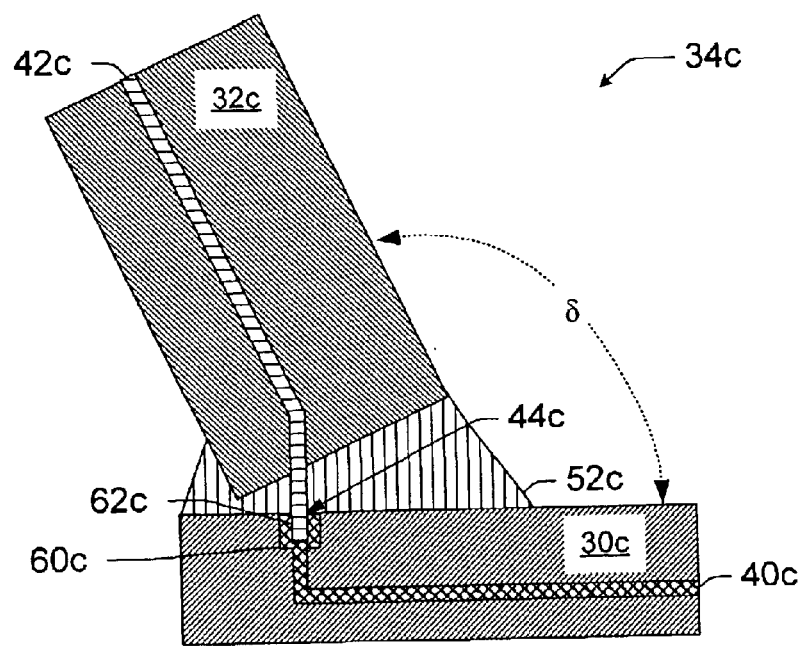
FIG. 10 shows a cross-sectional view of an exemplary electrical interconnect assembly in accordance with one embodiment.

FIG. 10 shows a cross-sectional view of another exemplary electrical interconnect assembly 34c. This embodiment comprises a first support structure 30c supporting a first conductor 40c, and a second support structure supporting 32c supporting a second conductor 42c. In this embodiment, the two supporting structures 30c, 32c and a majority of their associated conductors 40c, 42c are oriented at an angle δ that is greater than 0 degrees and is less than 180 degrees. In this particular embodiment, an obtuse angle δ of about 120 degrees is utilized. Other examples may form an acute angle δ. Such an embodiment is described below in relation to FIG. 12. Examples of other suitable configurations are described above and below.

In some embodiments, first conductor 40c has a terminal portion 60c comprising a receptacle for receiving a terminal end 62c of the second conductor 42c. Inserting the second conductor's terminal end 62c into the receptacle can form an electrical interconnect 44c between the two components. This electrical interconnect 44c may or may not have an electrically connecting material, such as solder, applied thereon either prior to, or subsequent to, inserting the second conductor's terminal end into the first terminal portion's receptacle.

Figure 11:
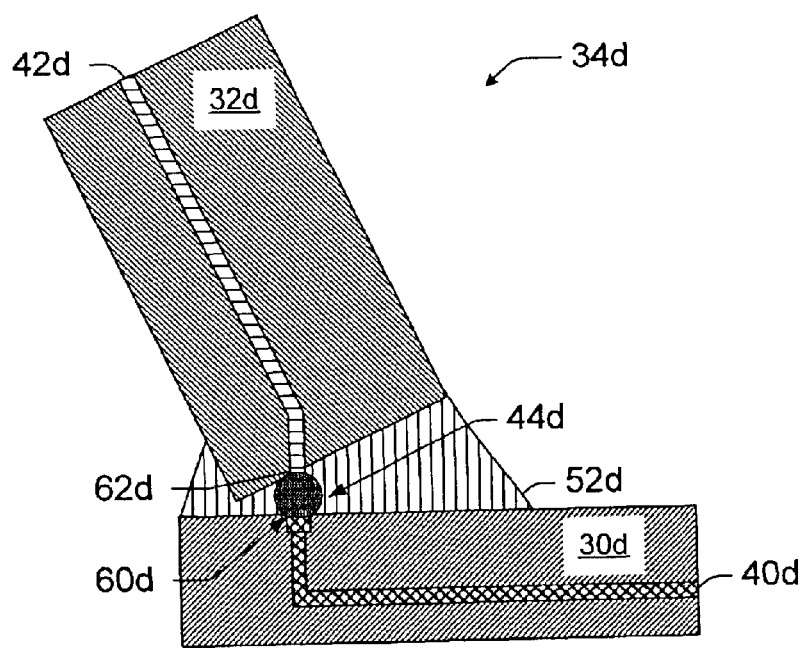
FIG. 11 shows a cross-sectional view of another exemplary electrical interconnect assembly in accordance with one embodiment.

FIG. 11 shows a cross-sectional view of yet another exemplary electrical interconnect assembly 34d. This embodiment comprises a first support structure 30d supporting a first conductor 40d, and a second support structure supporting 32d supporting a second conductor 42d. First conductor 40d has a surface mount portion 60d comprising a solder ball forming an electrical interconnect 44d between second conductor 42d and the surface mount portion.

A protective material 52d can be distributed around electrical interconnect 44d to protect the electrical interconnect from degradation. Examples of such degradation are described above and include damage caused by various fluids such as inks. Some inks are water based and contain compounds which can lead to degradation even when the water has evaporated or otherwise dissipated. In such embodiments, a protective material can be selected which protects the electrical interconnect from degradation from fluids and/or various solid compounds which may otherwise damage the electrical interconnect. The skilled artisan will recognize other suitable embodiments.

In the embodiments illustrated above, the first and second support structures 30, 32 are represented as being generally rectangular with two pairs of generally opposing surfaces. Other suitable embodiments can have other suitable configurations.

Figure 12:
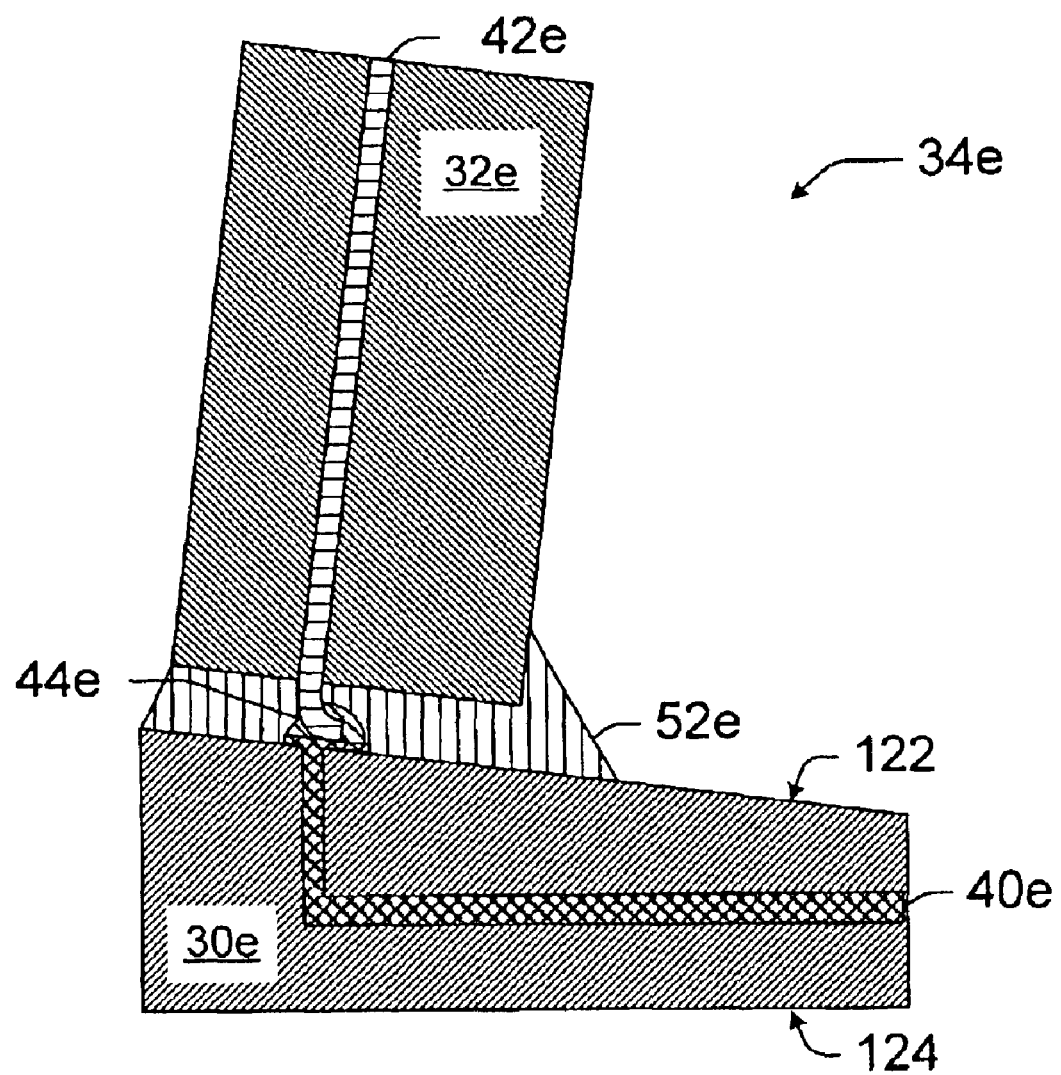
FIG. 12 shows a cross-sectional view of another exemplary electrical interconnect assembly in accordance with one embodiment.

FIG. 12 illustrates another exemplary electrical interface assembly 34e. In this embodiment a first support structure 30e has a first surface 122 that is not parallel to a second surface 124. This configuration can allow second support structure 32e and a majority of its associated second conductor 42e to be oriented substantially normally to first surface 122 while the two support structures 30e, 32e are non-orthogonal to one another. Such a configuration can, in some embodiments, contribute to ease of assembly and disassembly of an electrical interconnect assembly with other components to form a print cartridge or other functional unit.

In the present embodiment, protective material 52e provides fluid protection to electrical interconnect 44e by bonding to first and second support structures 30e, 32e. Protective material 52e can further ensure the integrity of the electrical connections by among other ways stabilizing the electrical interconnect 44e and associated portions of first and second conductors. This configuration can reduce stress concentrations at the electrical interconnect(s) and distribute such stresses to other portions of the conductors and/or the support structures.

For ease of illustration, many of the exemplary embodiments described above are illustrate only in cross-sectional views. The skilled artisan will recognize that the embodiments are suitable for various arrangements of the conductors on the associated support structures. For example, the described embodiments are applicable to linear or generally linear arrays of electrical interconnects. Further, the described embodiments lend themselves to non-symmetrical configurations of the support structures and associated conductors.

Conclusion

The described embodiments provide methods of assembling electrical interconnect assemblies and resultant assemblies. The electrical interconnect assemblies can allow conductors from two different components or support structures to be electrically connected at an electrical interconnect. The electrical interconnect assembly(s) can have a protective material positioned around the electrical interconnect to reduce degradation caused by ink and/or other materials to the electrical interconnect and associated conductors. The protective material can also provide other advantages such as mechanical stabilization to the electrical interconnect assemblies.

Although the invention has been described in language specific to structural features and methodological steps, it is to be understood that the invention defined in the appended claims is not necessarily limited to the specific features or steps described. Rather, the specific features and steps are disclosed as preferred forms of implementing the claimed invention.

What is claimed is:

1. An ink jet print cartridge forming method comprising:
   applying solder paste to a first substrate in a predetermined pattern;
   contacting the solder paste with multiple conductors positioned on a second substrate;
   melting the solder paste at a first temperature;
   applying a material that has a sufficient viscosity to allow the material to flow around the exposed conductors; and,
   curing the material at a second temperature higher than room temperature and lower than the first temperature so that the material becomes generally non-flowing and provides ink protection to the conductors and further stabilizes the first substrate relative to tho second substrate and wherein the act of curing also anneals at least a portion of the ink jet cartridge.

2. The method of claim 1, wherein the act of contacting comprises contacting the solder paste with multiple j-leg conductors.

3. The method of claim 1, wherein the act of contacting comprises contacting the solder paste with multiple j-leg conductors arranged in a generally linear array.

4. The method of claim 1, wherein the act of contacting comprises contacting the solder paste with multiple conductors positioned on the second substrate where the second substrate is oriented at an angle in a range of 1 degree to 89 degrees relative to the first substrate when viewed transverse to a long axis of the print cartridge.

5. An electrical interconnect assembly forming method comprising:
   forming an electrical interconnect between one or more conductors of a first support structure and one or more conductors of a second support structure;
   distributing a generally flowable material over the electrical interconnect such that the generally flowable material flows between the first and second support structures, at least in part, due to capillary action; and,
   exposing the generally flowable material to conditions sufficient to render the generally flowable material into a generally non-flowable state that provides fluid protection to the electrical interconnect and supports the electrical interconnect to reduce stress concentration at the electrical interconnect.

6. The method of claim 5, wherein said forming comprises positioning the first support structure at angle greater than zero degrees and less than 90 degrees relative to the second support structure.

7. The method of claim 5 further comprising annealing the electrical interconnect.

8. The method of claim 7, wherein the act of annealing occurs prior to the act of distributing.

9. The method of claim 5, wherein the act of exposing comprises heating which also anneals the electrical interconnect.

10. The method of claim 5, wherein the act of exposing causes the generally flowable material to adhere to the first support structure and the second support structure and contributes to maintaining an orientation therebetween.

11. The method of claim 5 further comprising incorporating the first and second support structures into an ink jet print cartridge.

12. The method of claim 5, wherein the act of distributing comprises dispensing the generally flowable material with a syringe.

13. The method of claim 5, wherein the act of distributing comprises distributing the generally flowable material at room temperature.

14. The method of claim 5, wherein the act of distributing comprises distributing the generally flowable material at a temperature higher than room temperature.

15. The method of claim 5, wherein the act of distributing comprises distributing the generally flowable material at a temperature higher than room temperature, and wherein said temperature of the generally flowable material facilitates movement of the generally flowable material.

16. The method of claim 5, wherein the act of forming comprises forming an electrical interconnect between one or more conductors of a first support structure and one or more conductors of a second support structure such that the first and second support structure are about 0.008 inches to about 0.0010 inches apart.

17. The method of claim 5, wherein the act of exposing comprises heating the generally flowable material to a desired temperature which is higher than room temperature and lower than a melting point of solder comprising the electrical interconnect.

18. An electrical interconnect assembly forming method comprising:

forming an electrical interconnect between multiple conductors of a first support structure and multiple conductors of a second support structure such that the multiple conductors of the first support structure define a first angular relationship relative to the multiple conductors of the second support structure;

distributing a generally flowable material over the electrical interconnect;

holding the multiple conductors of the first support structure relative to the multiple conductors of the second support structure to define a second different angular relationship; and, exposing the generally flowable material to conditions sufficient to render the generally flowable material into a generally non-flowable state that maintains the multiple conductors of the first support structure in the second different angular relationship relative to the multiple conductors of the second support structure and that provides fluid protection to the electrical interconnect.

* * * * *

UNITED STATES PATENT AND TRADEMARK OFFICE
CERTIFICATE OF CORRECTION

| | | |
|---|---|---|
| PATENT NO. | : 6,913,343 B2 | Page 1 of 1 |
| APPLICATION NO. | : 10/426584 | |
| DATED | : July 5, 2005 | |
| INVENTOR(S) | : Mohammad Akhavain et al. | |

It is certified that error appears in the above-identified patent and that said Letters Patent is hereby corrected as shown below:

On the Title page, in field (56), under "U.S. Patent Documents", in column 2, line 17, delete "2002/6433419    1/2002    Mori" and
insert -- 6,433,419   08/2002    Khandros et al. --, therefor.

In column 8, line 30, in Claim 1, delete "tho" and insert -- the --, therefor.

Signed and Sealed this

Twenty-first Day of July, 2009

JOHN DOLL
*Acting Director of the United States Patent and Trademark Office*